(12) United States Patent
Wang et al.

(10) Patent No.: US 7,402,882 B2
(45) Date of Patent: Jul. 22, 2008

(54) METHODS TO ELIMINATE AMPLIFIER GLOWING ARTIFACT IN DIGITAL IMAGES CAPTURED BY AN IMAGE SENSOR

(75) Inventors: Shen Wang, Webster, NY (US); William F. DesJardin, Holley, NY (US); Robert P. Fabinski, Rochester, NY (US); David N. Nichols, Fairport, NY (US); Christopher Parks, Rochester, NY (US); Eric G. Stevens, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/924,061

(22) Filed: Aug. 23, 2004

(65) Prior Publication Data
US 2006/0038203 A1 Feb. 23, 2006

(51) Int. Cl.
*H01L 29/72* (2006.01)
(52) U.S. Cl. .................... 257/435; 257/81; 257/99; 257/223; 257/225; 257/230; 257/294
(58) Field of Classification Search .................. 257/225, 257/81, 99, 223, 230, 294, 435
See application file for complete search history.

(56) References Cited
U.S. PATENT DOCUMENTS
6,052,222 A * 4/2000 Kitamura ................ 359/344

| | | | |
|---|---|---|---|
| 6,218,692 B1 * | 4/2001 | Guidash et al. | 257/292 |
| 2002/0021402 A1 * | 2/2002 | Hirabayashi et al. | 349/187 |
| 2005/0212936 A1 * | 9/2005 | Parks | 348/296 |
| 2007/0020791 A1 * | 1/2007 | Hsu et al. | 438/22 |

FOREIGN PATENT DOCUMENTS
JP 07248610 * 9/1995

* cited by examiner

*Primary Examiner*—Edward Wojciechowicz
(74) *Attorney, Agent, or Firm*—Peyton C. Watkins

(57) ABSTRACT

A charge coupled device includes a substrate; a plurality of image pixels arranged in a two dimensional array in the substrate for capturing an electronic representation of an image and for transferring charge in a first direction; a transfer mechanism for transferring charge in a second direction from the plurality of the image pixels for further processing; an amplifier structure disposed in the substrate that receives the charge from the transfer mechanism and converts the charge into a voltage signal; a first opaque layer spanning over the amplifier for blocking near-infrared light inherently generated by an electrical field within the amplifier structure when a voltage is applied; and a second opaque layer deposited into the substrate for also blocking near-infrared light inherently generated by an electrical field within the amplifier structure when a voltage is applied.

20 Claims, 4 Drawing Sheets

METHODS TO ELIMINATE AMPLIFIER GLOWING ARTIFACT IN DIGITAL IMAGES CAPTURED BY AN IMAGE SENSOR

FIELD OF THE INVENTION

This invention relates to the field of an image sensor, and more particularly to such image sensor with a structure in its output amplifier to eliminate its glowing artifact in the images captured by the sensor.

BACKGROUND OF THE INVENTION

A traditional camera system includes camera body, lens, electronics to control the functionality of the camera and most importantly the image-capturing media—film. In contrast, instead of using film, a digital camera system usually employs an image sensor made on semiconductor substrate. Typically the image sensor is either a charge coupled device (CCD) or a complementary metal oxide semiconductor (CMOS) sensor. They can be either in two-dimensional array called area sensor or one-dimensional array called linear sensor. For illustrative purpose, the image sensor discussed in this patent is an area CCD image sensor.

An area CCD image sensor consists of a two-dimensional array of photosensitive elements called pixels of X columns by Y rows. These pixels capture light from a scene of interest during exposure and converts photons to electrical charge, namely electrons. The electrons are then transferred out of the CCD vertically and horizontally. Each CCD has at least one output structure or amplifier, which consists of one or more transistors to convert the electrons from the pixels to voltage signals. These voltage signals are then sampled and converted to digital counts through a correlated double sampling (CDS) and analog-to-digital converter (ADC). Finally a digital image processor processes these digital counts and the counts are rendered as a digital image.

An amplifier typically consists of transistors, each of which has a drain, a source and a gate. Referring to FIG. 1A, there is shown a symbol to represent a transistor. Also referring to FIG. 1B there is shown a cross-section of an NMOS or n-channel transistor 1 built on a p-type silicon layer 5. It is noted that other types of transistors are applicable to the present invention, in which case the doping will vary accordingly, as those skilled in the art will readily recognize. The source 2 and drain 3 of the transistor 1 consist of n-type doping regions. The voltage at contact 6 of the source 2 is modulated by the voltage on the gate 4 when the transistor 1 is operated in a source-follower amplifier configuration. The drain 3 of the transistor 1 in this amplifier configuration is connected to a high-voltage applied to the contact 7, commonly referred to as VDD. This high voltage at drain 3 will create a strong electric field between the gate 4 and the drain 3 that may generate near-infra-read (NIR) light. This NIR light can propagate inside the silicon or radiate outside and over the silicon. If the light or electrons created thereby eventually enter the image area of the CCD, it will cause a spurious signal in the image area. These additional charges will superimpose with the existing charge related to the scene of interest and create a glowing phenomenon or artifact seen in one of the corners of the CCD where the amplifier is located.

Referring to FIG. 2 there is shown a diagram of a CCD 10 which has an amplifier 13 at the top-left corner. Charge is first transferred vertically row by row into a serial of horizontal register 14. The vertical transfer direction is indicated by an arrow 15. After each row of transfer, charge in the horizontal registers 14 is then transferred horizontally to the output amplifier 13. The horizontal transfer direction is indicated by an arrow 16. The light emitting from the amplifier 13 enters some portions of the top-left corner of image area 12 and creates so-called amplifier glowing artifact in that region 12 of the whole image area 11. The extra signal from the glowing will contaminate the image in that region if not removed or substantially reduced.

Referring to FIG. 3 there is shown a cross section of an amplifier transistor 20 in a CCD image sensor 28. It includes a source 21, a drain 22 and a gate 23. The source 21 and drain 22 typically consist of n-type doping and they are connected to metal contacts 24 and 34, respectively. Light mainly generates along the gate-drain side 25 and it propagates in every direction as indicated by the arrows. Among them there are three paths which may potentially impact the image area 12. One is the path 30 through which light strikes onto top layers (not shown) over the silicon surface 29 including oxides, protection layers and a cover glass (not shown) etc, and then bounces back into the image area 12. Another one is the path 31 through which the light passes through and underneath the silicon surface 29 and within the p-type epi layer 26 and reaches the image area 12. Path 31 has another potential impact. The charge 33, namely electrons, generated by the light along the path 31 can diffuse into the image area 12 also. Path 32 has little impact because of two reasons. One reason is the light going deep into the p+-type substrate 27 will be either absorbed by the silicon or pass through and out of the substrate 27. There will be no light reflection into the image area 12 from path 32. The charge 33 in the substrate 27 generated by the absorbed light will recombine quickly because of its short diffusion length in that region. Therefore, there is virtually no charge diffusion into the image area 12 either. This is particularly true for devices built in a well or a tub with opposite conductivity type to the substrate in which this well is formed. In summary, paths 30 and 31 have the most significant impact on creating the glowing artifact in the image area 12.

Since an amplifier only glows when the VDD voltage is applied to it, the prior art solution to this problem is to minimize the time when the amplifier operates, which means during the exposure time, VDD is reduced or set to zero to turn off the amplifier. This method will remove the glowing during exposure, but the amplifier needs to be turned back on during CCD readout and in that period, the glowing will appear again and it will affect the images which the CCD captures. In this case, the glowing will cause a white band across the image. Therefore, the impact from the amplifier glowing cannot be completely removed by this method. Besides, switching VDD ON and OFF can sometimes generate unnecessary electronic noise in the system.

Therefore, there is a need to prevent the amplifier glowing from entering the image sensor's image area and creating a glowing artifact in the images which the image sensor captures.

SUMMARY OF THE INVENTION

It is, therefore, an object of the present invention to design a glowing-artifact-free image sensor. This object is achieved by two methods. One is to encapsulate the area above the amplifier to prevent the light from reflecting and propagating back into the image area of the sensor. The other one is to cut a trench and deposit a metal to prevent the light from propagating through and within the silicon into the image area.

DETAILED DESCRIPTION OF THE INVENTION

Figure 1B:
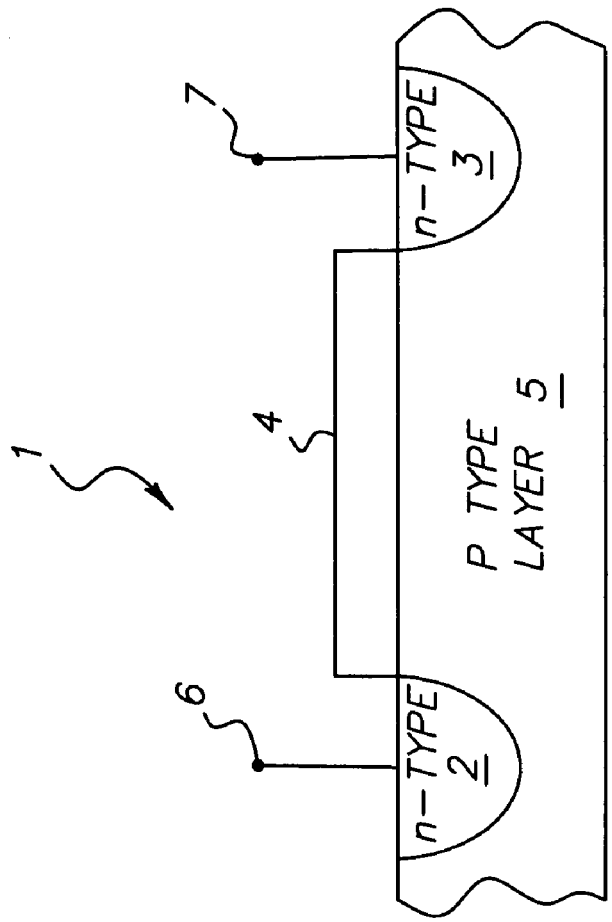
FIG. 1A is a symbolic representation of a transistor and 1B is the cross section of a typical NMOS transistor built on a silicon substrate.
Figure 1A:
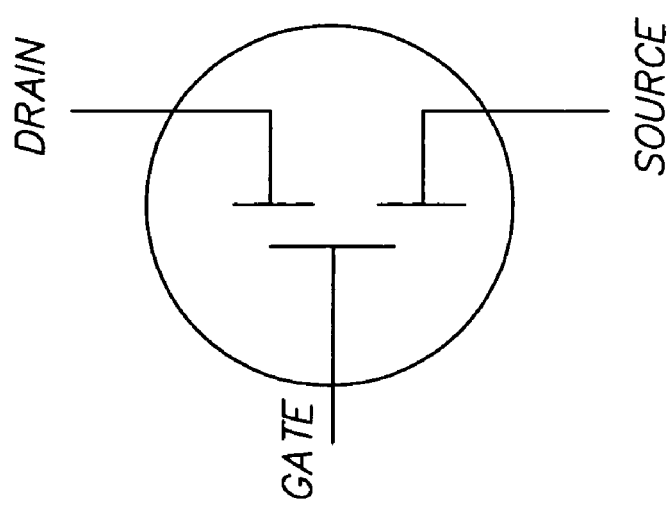
Figure 2:
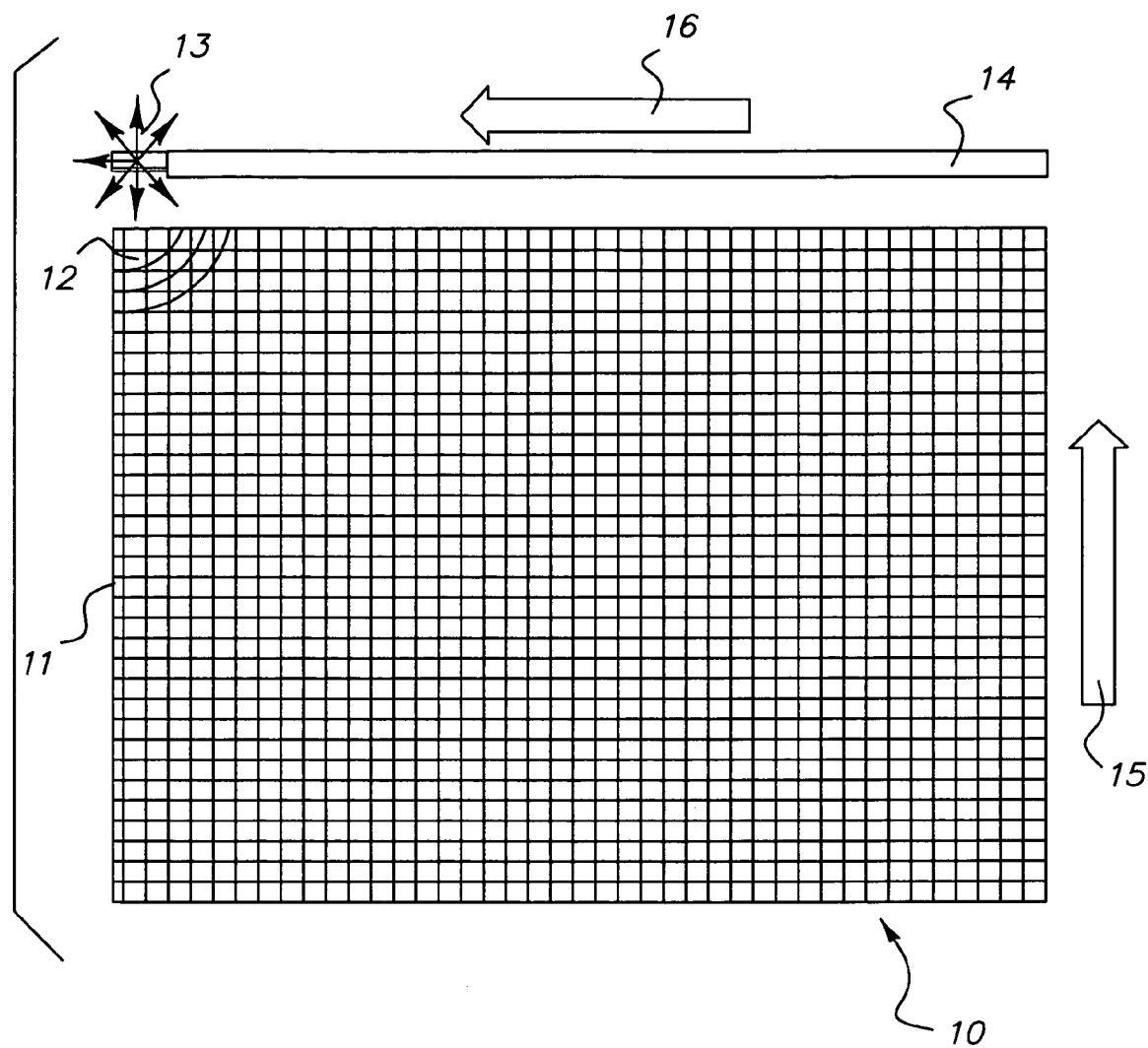
FIG. 2 is the top view of a CCD image sensor and its output amplifier.
Figure 3:
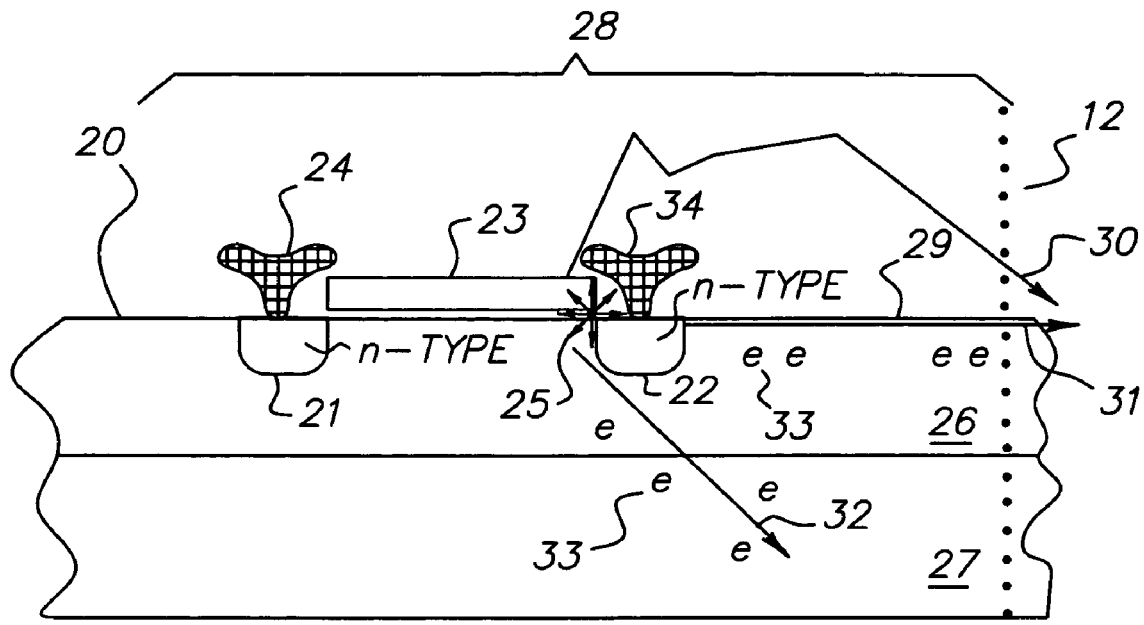
FIG. 3 is the cross section of an output amplifier.
Figure 4:
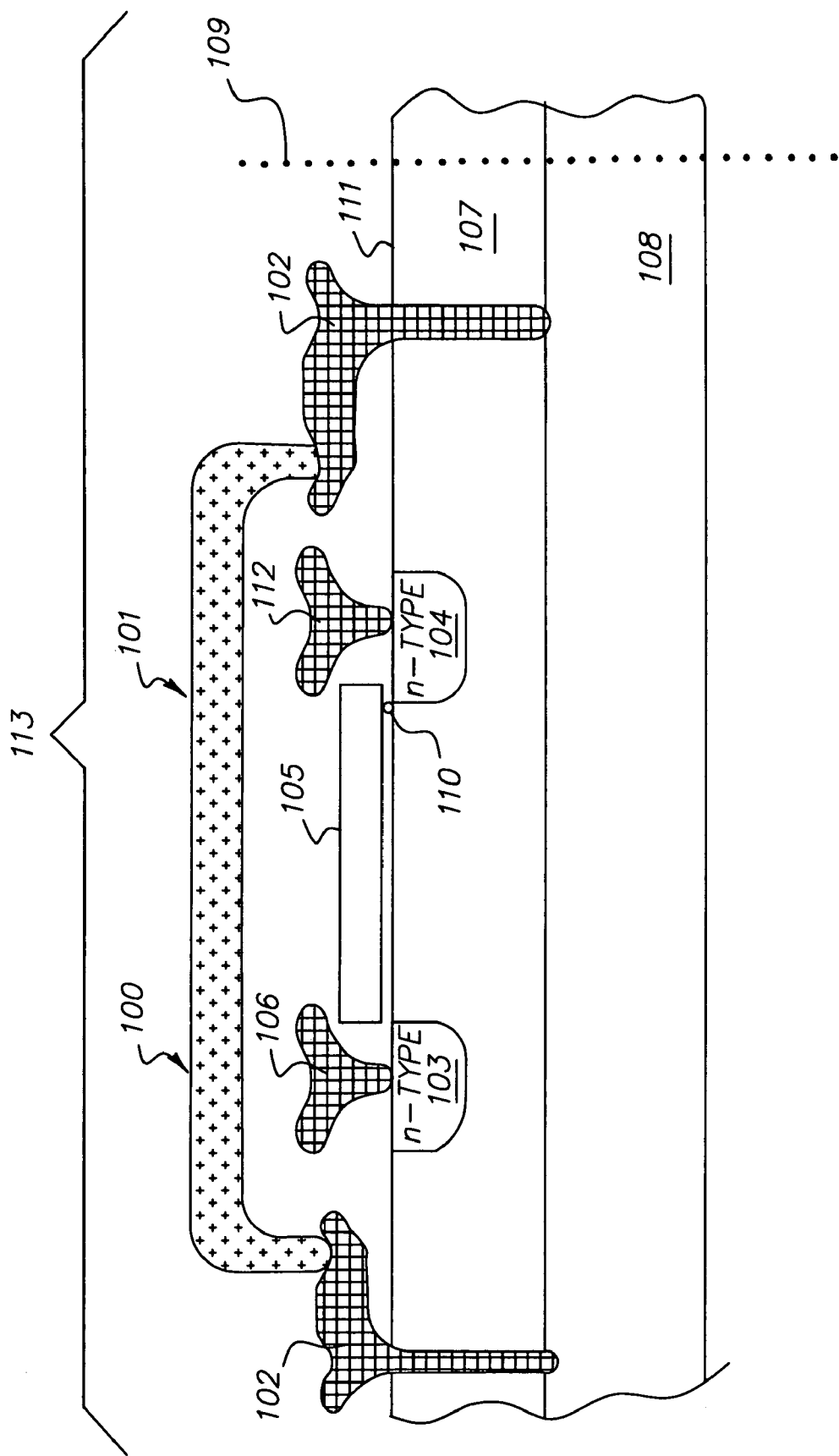
FIG. 4 is the cross section of an output amplifier of the present invention with a metal cover to prevent the light from entering the image area from above the silicon surface, and a metal block to prevent light from passing through within the epi layer underneath the silicon surface.

Referring to FIG. 4, there is shown the output portion of a CCD image sensor 113 having an amplifier 100 of the present invention with the solution to remove the glowing-artifact in its image area 109. It is noted that the image sensor 113 includes both the amplifier 100 and the imaging area 109. The image area 109 includes a plurality of pixels (not shown) for capturing an electronic representation of an image. The output amplifier 100 includes a p+-type substrate 108 having an amplifier transistor built with a source 103, typically n-type doping, a drain 104, also typically n-type doping, and a gate 105. The metal contacts 106 and 112 are connected to the source 103 and drain 104, respectively. The n-type doping 103 and 104 are built in a p-type epi layer 107. In order to block light propagation above the silicon surface 111, a metal cover 101 is deposited over and spanning on top of the transistor (103, 104 and 105). The light blocked by the cover 101 is that from path 30 of FIG. 3. The cover 101 connects with a contact 102 made from a metal layer which also connects to the p-type epi layer 107 to encapsulate the amplifier 100. The metal contact 102 is deposited deep through the epi layer 107 and into the p+-type substrate 108 to prevent any light generated in the area 110 from passing through epi layer 107 into the image area 109. The blocked light is that from path 31 of FIG. 3. Also it blocks any charge, typically electrons, generated from the light from migrating into the image area 109.

Another beneficial measure to the design is to place the amplifier 100 as far away from the CCD image area 109 as possible.

The advantage of the structure of present invention is that it prevents the amplifier glowing from affecting the CCD image area and therefore contaminating the images it captures.

Figure 5:
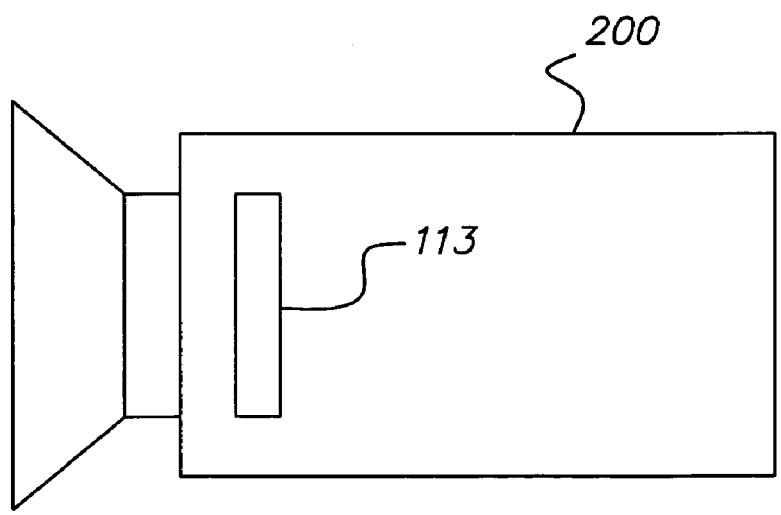
FIG. 5 is a block diagram of a camera having a CCD.

Referring to FIG. 5, there is shown a digital camera 200 for illustrating a typical commercial embodiment for the image sensor 113.

This invention has been described in detail with a particular configuration of an image sensor output amplifier, but it will be understood that variations and modifications can be effected within the spirit and scope of the invention.

For example, although this invention has been described using a p-type silicon substrate with n-type source and drain, an n-type substrate could be also used with p-type source and drain, or an n-type substrate with a p-well wherein the output amplifier is made in the p-well.

In addition, if there is a transistor built on silicon substrate, it will potentially create near-infra-red light. If an image sensor has a circuitry including transistors, the circuitry can emit NIR light. Therefore, this patent also can be applied to other types of sensors, such as a CMOS image sensor.

PARTS LIST

1 NMOS transistor
2 source
3 drain
4 gate
5 p-type silicon layer
6 contact
7 contact
10 CCD
11 whole image area
12 image area with glowing artifact
13 amplifier
14 horizontal registers
15 vertical transfer direction/arrow
16 horizontal transfer direction/arrow
20 amplifier transistor
21 source
22 drain
23 gate
24 metal contact
25 light generation region/gate drain side
26 p-type epi layer
27 p+-type substrate
28 CCD image sensor
29 silicon surface
30 light propagation path over the surface
31 light propagation path within the epi layer
32 light propagation path through the substrate
33 light-generated electrons/charge
34 metal contact
100 amplifier
101 metal cover
102 metal block
103 source
104 drain
105 gate
106 metal contacts
107 p-type epi layer
108 p+-type substrate
109 image area
110 light generation region
111 silicon surface
112 metal contact
113 CCD image sensor
200 camera

The invention claimed is:

1. A charge coupled device comprising:
    (a) a base layer;
    (b) a plurality of image pixels arranged in at least a one dimensional array in the base layer for capturing an electronic representation of an image;
    (c) a transfer mechanism for reading out the image from the array;
    (d) an amplifier transistor with a source and drain disposed in the base layer that receives the charge from the transfer mechanism, wherein an electric field within the amplifier transistor inherently generates light when a voltage is applied to the amplifier transistor;
    (e) a first opaque layer spanning over the amplifier transistor for blocking the inherently generated light and preventing the light from propagating out from the amplifier transistor and striking a top layer of one or more image pixels; and
    (f) a second opaque layer deposited into the base layer and in contact with the first opaque layer for also blocking the inherently generated light and preventing the light from propagating through the base layer and the charge created therefrom from passing into one or more image pixels; wherein the first and second opaque layers form an encapsulation for the amplifier transistor that contains the inherently generated light within the encapsulation.

2. The charge coupled device as in claim 1, wherein the first and second layers are metal.

3. The charge-coupled device as in claim 1, wherein the amplifier structure includes at least one transistor.

4. An image sensor comprising:
(a) a base layer;
(b) a plurality of image pixels arranged in at least a one dimensional array in the base layer for capturing an electronic representation of an image;
(c) a transfer mechanism for reading out the image from the array;
(d) an amplifier transistor with a source and drain disposed in the base layer that receives the charge from the transfer mechanism, wherein an electric field within the amplifier transistor inherently generates light when a voltage is applied to the amplifier transistor;
(e) a first opaque layer spanning over the amplifier transistor for blocking the inherently generated light and preventing the light from propagating out from the amplifier transistor and striking a top layer of one or more image pixels; and
(f) a second opaque layer deposited into the base layer and in contact with the first opaque layer for also blocking the inherently generated light and preventing the light from propagating through the base layer and the charge created therefrom from passing into one or more image pixels; wherein the first and second opaque layers form an encapsulation for the amplifier transistor that contains the inherently generated light within the encapsulation.

5. The image sensor as in claim 4, wherein the first and second layers are metal.

6. A camera comprising:
an image sensor comprising:
(a) a base layer;
(b) a plurality of image pixels arranged in at least a one dimensional array in the base layer for capturing an electronic representation of an image;
(c) a transfer mechanism for reading out the image from the array;
(d)) an amplifier transistor with a source and drain disposed in the base layer that receives the charge from the transfer mechanism, wherein an electric field within the amplifier transistor inherently generates light when a voltage is applied to the amplifier transistor;
(e) a first opaque layer spanning over the amplifier transistor for blocking the inherently generated light and preventing the light from propagating out from the amplifier transistor and striking a top layer of one or more image pixels; and
(f) a second opaque layer deposited into the base layer and in contact with the first opaque layer for also blocking the inherently generated light and preventing the light from propagating through the base layer and the charge created therefrom from passing into one or more image pixels; wherein the first and second opaque layers form an encapsulation for the amplifier transistor that contains the inherently generated light within the encapsulation.

7. The camera as in claim 6, wherein the first and second layers are metal.

8. The charge coupled device as in claim 1, wherein the base layer includes an epitaxial layer and a substrate.

9. The charge coupled device as in claim 8, wherein the first and second layers are metal.

10. The charge coupled device as in claim 8, wherein the second layer is deposited through the epitaxial layer and into the substrate for blocking light and charge created therefrom from passing into the image pixels.

11. The charge-coupled device as in claim 8, wherein the second layer extends out of the epitaxial layer, and the first layer also contacts the portion of the second layer extending out of the epitaxial layer.

12. The charge-coupled device as in claim 8, wherein the amplifier structure includes at least one transistor.

13. The image sensor as in claim 4, wherein the base layer includes an epitaxial layer and a substrate.

14. The image sensor as in claim 13, wherein the first and second layers are metal.

15. The image sensor as in claim 13, wherein the second layer is deposited through the epitaxial layer and into the substrate for blocking light and charge created therefrom from passing into the image pixels.

16. The image sensor as in claim 13, wherein the second layer extends out of the epitaxial layer, and the first layer also contacts the portion of the second layer extending out of the epitaxial layer.

17. The image sensor as in claim 6, wherein the base layer includes an epitaxial layer and a substrate.

18. The camera as in claim 17, wherein the first and second layers are metal.

19. The camera as in claim 6, wherein the second layer is deposited through the epitaxial layer and into the substrate for blocking light from passing into the image pixels.

20. The camera as in claim 9, wherein the second layer extends out of the epitaxial layer, and the first layer also contacts the portion of the second layer extending out of the epitaxial layer.

* * * * *